US011682606B2

(12) United States Patent
Marlow et al.

(10) Patent No.: US 11,682,606 B2
(45) Date of Patent: Jun. 20, 2023

(54) SEMICONDUCTOR WITH INTEGRATED ELECTRICALLY CONDUCTIVE COOLING CHANNELS

(71) Applicant: Ford Global Technologies, LLC, Dearborn, MI (US)

(72) Inventors: Richard Marlow, Grimsby (CA); Craig Brian Rogers, Belleville, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 217 days.

(21) Appl. No.: 16/269,702

(22) Filed: Feb. 7, 2019

(65) Prior Publication Data

US 2020/0258812 A1    Aug. 13, 2020

(51) Int. Cl.
*H01L 23/46* (2006.01)
*H01L 23/49* (2006.01)
*H01L 23/00* (2006.01)

(52) U.S. Cl.
CPC .............. *H01L 23/46* (2013.01); *H01L 23/49* (2013.01); *H01L 24/48* (2013.01); *H01L 2224/48175* (2013.01); *H01L 2224/48245* (2013.01)

(58) Field of Classification Search
CPC ......... H01L 23/46; H01L 23/49; H01L 24/48; H01L 2224/48175; H01L 2224/48245; H01L 2224/4918; H01L 23/473; H01L 2924/00014; H01L 23/367; H01L 25/072
USPC ......................................................... 257/712
See application file for complete search history.

(56) References Cited

U.S. PATENT DOCUMENTS

| 5,660,227 | A | * | 8/1997 | Crowe | H01L 23/473 165/47 |
| 6,291,878 | B1 | * | 9/2001 | Anderson | H01L 23/055 257/691 |
| 7,763,970 | B2 | * | 7/2010 | Tschirbs | H01L 23/053 257/701 |
| 7,884,468 | B2 | * | 2/2011 | Mann | H01L 23/4735 257/714 |
| 8,872,328 | B2 | * | 10/2014 | Delgado | H01L 23/13 257/E23.08 |
| 9,735,089 | B2 | | 8/2017 | Kumar et al. | |
| 2002/0186545 | A1 | * | 12/2002 | Fukada | H01L 25/072 361/719 |
| 2003/0056940 | A1 | * | 3/2003 | Chu | H01L 23/473 257/E23.098 |
| 2004/0256710 | A1 | * | 12/2004 | Schwarzbauer | H01L 24/49 257/690 |
| 2005/0151244 | A1 | * | 7/2005 | Chrysler | H01L 23/473 257/713 |

(Continued)

FOREIGN PATENT DOCUMENTS

CN        206668927 U    11/2011

*Primary Examiner* — Sheikh Maruf
(74) *Attorney, Agent, or Firm* — David B. Kelley; Brooks Kushman P.C.

(57) ABSTRACT

A semiconductor assembly includes a power semiconductor, a housing containing the power semiconductor, and electrically conductive channels. The electrically conductive channels are arranged to direct coolant through the housing. Heat generated by the power semiconductor can therefore be absorbed by the coolant. The electrically conductive channels are also electrically connected with the power semiconductor to form terminals for the power semiconductor.

20 Claims, 2 Drawing Sheets

(56) References Cited

U.S. PATENT DOCUMENTS

| | | | | |
|---|---|---|---|---|
| 2005/0167820 A1* | 8/2005 | Wang | .................... | H01L 23/473 |
| | | | | 257/E23.098 |
| 2006/0103011 A1* | 5/2006 | Andry | .................. | H01L 25/0657 |
| | | | | 257/707 |
| 2008/0036076 A1* | 2/2008 | Ouyang | .................. | H01L 23/34 |
| | | | | 257/E23.098 |
| 2009/0032937 A1* | 2/2009 | Mann | .................. | H01L 23/4735 |
| | | | | 165/80.4 |
| 2009/0213553 A1* | 8/2009 | Tschirbs | .............. | H01L 23/3735 |
| | | | | 361/709 |
| 2010/0127390 A1* | 5/2010 | Barth | .................... | H01L 23/473 |
| | | | | 257/E23.098 |
| 2010/0133684 A1* | 6/2010 | Oka | .................... | H01L 23/3735 |
| | | | | 438/122 |
| 2011/0051371 A1* | 3/2011 | Azuma | .................. | B60K 6/445 |
| | | | | 361/699 |
| 2013/0154081 A1* | 6/2013 | Kadoguchi | ............. | H01L 24/37 |
| | | | | 257/712 |
| 2013/0154084 A1* | 6/2013 | Kadoguchi | ............. | H01L 24/40 |
| | | | | 257/717 |
| 2013/0181228 A1* | 7/2013 | Usui | ........................ | H01L 24/40 |
| | | | | 257/77 |
| 2016/0234967 A1* | 8/2016 | Choi | .................... | H05K 7/20918 |
| 2016/0254212 A1* | 9/2016 | Kusaka | .................. | F28F 21/084 |
| | | | | 361/699 |
| 2016/0315022 A1* | 10/2016 | Egusa | .................... | H01L 25/072 |
| 2017/0055378 A1* | 2/2017 | Zhou | .................... | H05K 7/20927 |
| 2017/0077020 A1* | 3/2017 | Mabuchi | ................ | H05K 1/117 |
| 2017/0092564 A1* | 3/2017 | Kumar | ................ | H01L 25/0657 |
| 2017/0133291 A1* | 5/2017 | Eisele | .................... | H01L 23/291 |
| 2017/0179108 A1* | 6/2017 | Okuda | .................. | H01L 29/7397 |
| 2017/0207143 A1* | 7/2017 | Ushijima | ............ | H01L 23/4006 |
| 2017/0338201 A1* | 11/2017 | Shimakawa | ............ | H01L 24/49 |
| 2018/0025962 A1* | 1/2018 | Dede | .................... | H01L 29/2003 |
| | | | | 257/712 |
| 2018/0042137 A1* | 2/2018 | Reeves | ................ | H01L 21/4878 |
| 2018/0190636 A1* | 7/2018 | Mukunoki | ........ | H01L 23/49838 |
| 2018/0261533 A1* | 9/2018 | Glenn | ............... | H01L 23/49562 |
| 2018/0279508 A1* | 9/2018 | Roan | .................... | H05K 1/0203 |
| 2018/0286774 A1* | 10/2018 | Nishibe | ................. | H02M 7/003 |
| 2018/0308820 A1* | 10/2018 | Joshi | ...................... | H01L 24/32 |
| 2018/0366400 A1* | 12/2018 | Mohn | .................... | H01L 23/5383 |
| 2019/0086162 A1* | 3/2019 | Cai | ........................ | F28D 15/0233 |
| 2019/0229032 A1* | 7/2019 | Oonishi | ................. | H01L 24/48 |
| 2020/0091677 A1* | 3/2020 | Dede | .................... | H01S 5/02438 |
| 2021/0066170 A1* | 3/2021 | Ji | ........................... | H01L 23/36 |

\* cited by examiner

SEMICONDUCTOR WITH INTEGRATED ELECTRICALLY CONDUCTIVE COOLING CHANNELS

TECHNICAL FIELD

This disclosure relates to cooling systems for semiconductor devices.

BACKGROUND

Power semiconductors are used as switches or rectifiers in certain power electronics, such as switch-mode power supplies. They are also called power devices or, when used in integrated circuits, power integrated circuits (ICs).

A power semiconductor is usually used in commutation mode (it is either on or off), and has a design optimized for such usage.

Power semiconductors are found in systems delivering tens of milliwatts (e.g., a headphone amplifier) and in systems delivering a gigawatt (e.g., a high voltage direct current transmission line).

SUMMARY

A semiconductor assembly includes a power semiconductor, a housing containing the power semiconductor, and electrically conductive channels. The electrically conductive channels direct coolant through the housing to absorb heat generated by the power semiconductor. The electrically conductive channels are electrically connected with the power semiconductor to form terminals for the power semiconductor.

A semiconductor device includes a semiconductor substrate and metal layers arranged to form a semiconductor switch, a housing containing the semiconductor switch, electrically conductive channels, and a power system. The electrically conductive channels carry fluid therethrough to cool the semiconductor switch and housing, and are electrically connected with the metal layers. The power system provides current or voltage to the electrically conductive channels.

A power apparatus has a semiconductor assembly including a semiconductor switch, a housing containing the semiconductor switch, and electrically conductive channels electrically connected with the semiconductor switch. The electrically conductive channels direct coolant through the housing to absorb heat generated by the semiconductor switch. The power apparatus also has a heat transfer system and a power system. The heat transfer system moves the coolant through the electrically conductive channels. The power system provides current or voltage to the electrically conductive channels.

DETAILED DESCRIPTION

Figure 1:
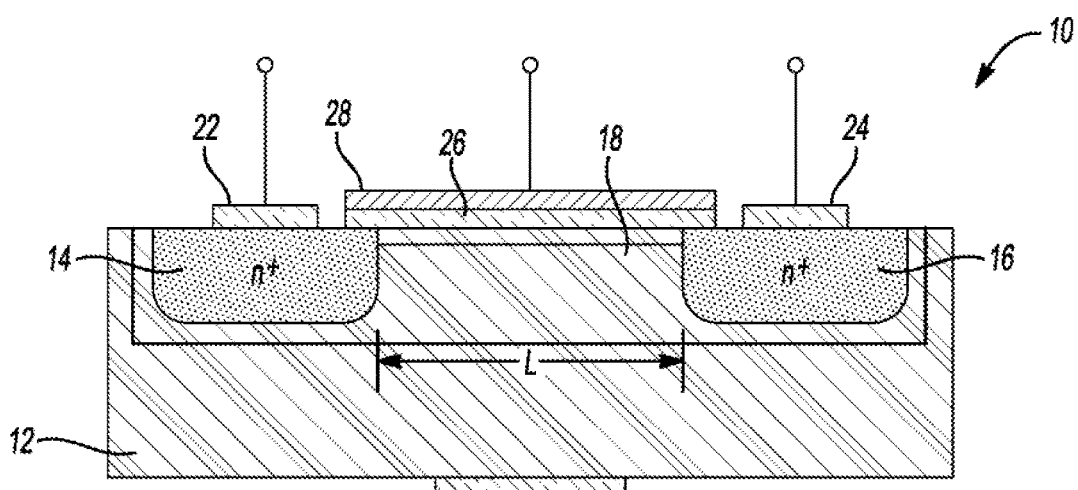
FIG. 1 is a side view, in cross-section, of a metal-oxide-semiconductor field-effect transistor.

Various embodiments of the present disclosure are described herein. However, the disclosed embodiments are merely exemplary and other embodiments may take various and alternative forms that are not explicitly illustrated or described. The figures are not necessarily to scale; some features may be exaggerated or minimized to show details of particular components. Therefore, specific structural and functional details disclosed herein are not to be interpreted as limiting, but merely as a representative basis for teaching one of ordinary skill in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. However, various combinations and modifications of the features consistent with the teachings of this disclosure may be desired for particular applications or implementations.

Example power semiconductors include the insulated-gate bipolar transistor (IGBT), the power diode, the power metal-oxide-semiconductor field-effect transistor (MOSFET), and the thyristor.

An IGBT often has characteristics common to bipolar junction transistors (BJTs) and MOSFETs. It may have a high gate impedance and thus low gate current requirements like a MOSFET. It may have a low on state voltage drop in the operating mode like a BJT. Certain IGBTs can be used to block both positive and negative voltages.

MOSFETs can be depletion channel devices or enhancement channel devices. Voltage, not current, may be necessary to control the conduction path from drain to source. At low frequencies, this can reduce gate current because it is only required to charge gate capacitance during switching. Switching times range from tens of nanoseconds to a few hundred microseconds. Typically, MOSFET devices are not bi-directional and are not reverse voltage blocking.

A thyristor can describe a family of three-terminal devices that includes silicon-controlled rectifiers (SCRs), gate turn-off thyristors (GTOs), and MOS-controlled thyristors (MCTs). A gate pulse typically may turn on these devices. And responsive to the anode voltage falling below a value relative to the cathode, the devices may turn off. When off, they can block reverse voltages in certain configurations.

SCRs operate like a standard diode when a gate pulse is present. As mentioned above, some of these devices turn off and block positive or negative voltages present when the anode is negative compared to the cathode. The gate voltage may not allow the device to turn off.

GTOs can be turned on and off with a gate pulse. Typically, the turn off gate voltages are larger and require more current than the turn on levels. This turn off voltage is a negative voltage from gate to source. A snubber circuit may be required to provide a usable switching curve. Without the snubber circuit, the GTO may not be able to be used for turning inductive loads off.

MCI's can be triggered on or off by a pulse to its MOSFET gate. As such, there is little current flow, allowing for low power control signals. These are typically constructed with two MOSFET inputs and a pair of BJT output stages, although other arrangements are possible. Input MOSFETs are configured to allow turn on control during positive and negative half cycles. The output BJTs may be configured to allow for bidirectional control and low voltage reverse blocking.

With reference to FIG. 1 and with more particularity, an example metal-oxide-semiconductor field-effect transistor (MOSFET) 10 includes a body (p-type substrate) 12 with n+ doped regions 14, 16, separated by a distance, L, which forms a channel region 18. Opposite the n+ doped regions 14, 16, the body 12 has thereon a metal layer 20. Likewise, each of the n+ doped regions 14, 16 has thereon respective metal layers 22, 24. The n+ doped region 14 and the metal layer 22 form the source (S). The n+ doped region 16 and the metal layer 24 form the drain (D). And the channel region 18 has thereon an insulating (e.g., oxide) layer 26 and a metal layer 28 forming a portion of the gate (G). As depicted, the MOSFET 10 is a four-terminal device. Connecting the body 12 and source (S), however, will yield a three-terminal device.

Application of a voltage to the gate (G) will prompt formation of an electrical pathway in the channel region 18 that will permit electrons to flow between the source (S) and drain (D). This operation may generate heat.

Cooling arrangements can be used to carry heat away from semiconductor devices. For example, internal passages or channels around or through the housing of a semiconductor device can be used to direct coolant flow therethrough. Here, however, we propose the integration of the electrical conductors of the semiconductor device with the cooling channels thereof. Such combination may eliminate certain electrical components, yielding a smaller overall package.

Figure 3:
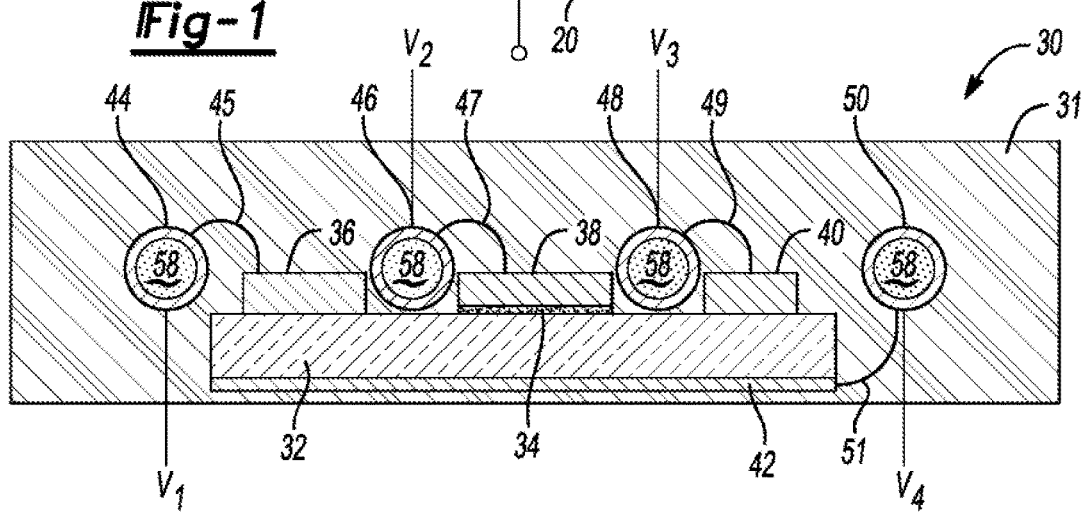
FIG. 3 is a side view, in cross-section, of the semiconductor device of FIG. 2.
Figure 2:
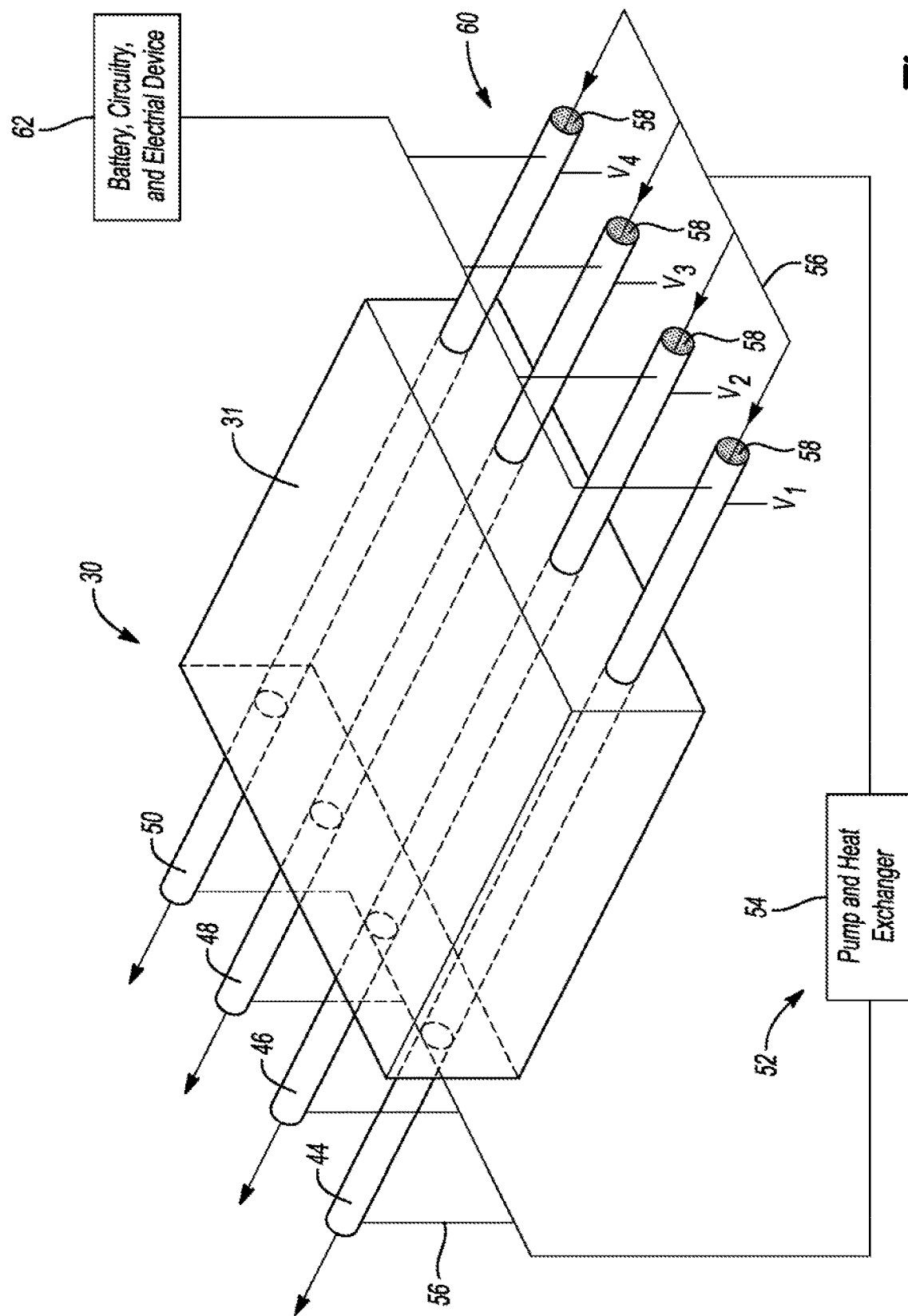
FIG. 2 is a perspective view of a semiconductor device with integrated electrically conductive cooling channels.

With reference to FIGS. 2 and 3, an example semiconductor switch 30 (e.g., a MOSFET) includes a housing 31 (e.g., a plastic or otherwise electrically insulative housing), a body 32, which may include doped regions, a channel region, etc., an insulating layer 34, and metal layers 36, 38, 40, 42 contained within the housing 31. The semiconductor switch 30 also includes electrically conductive (e.g., metal) microchannels 44, 46, 48, 50 contained within the housing 31.

A heat transfer system 52 may be used in concert with the electrically conductive microchannels 44, 46, 48, 50 to facilitate the removal of heat from the semiconductor switch 30 during operation. The heat transfer system 52 may include a pump and heat exchanger 54 and associated conduits 56, which may be electrically non-conductive, in fluid communication with the electrically conductive microchannels 44, 46, 48, 50. The pump 54 may operate to move coolant 58 through the electrically conductive microchannels 44, 46, 48, 50 via the conduits 56. The proximity of the electrically conductive microchannels 44, 46, 48, 50 to the various components of the semiconductor switch 30 will permit the transfer of heat from the semiconductor switch 30 to the coolant 58. Heat carried by the coolant 58 can then be discharged via the heat exchanger 54.

A power system 60 may be used in concert with the electrically conductive microchannels 44, 46, 48, 50 to facilitate operation of the semiconductor switch 30. The power system 60 may include a battery (or other power source), circuitry, and an electrical device 62 to be serviced by the semiconductor switch 30. In this example, each of the electrically conductive microchannels 44, 46, 48, 50 is electrically connected with a respective one of the metal layers 36, 38, 40, 42 via wire leads 45, 47, 49, 51. The metal layer 36 forms part of the source (S). The metal layer 38 forms part of the gate (G). The metal layer 40 forms part of the drain (D). And the metal layer 42 forms part of the body 32. The electrically conductive microchannels 44, 46, 48, 50 thus provide electrical pathways from inside the housing 31 to outside the housing 31, thereby eliminating separate components providing similar function. That is, the electrically conductive microchannels 44, 46, 48, 50 are the terminals for the source (S), gate (G), drain (D), and body 32.

A variety of materials and configurations can be used to implement the electrically conductive microchannels in the example of FIG. 3, metal tubes are used. Passageways, however, may be formed (e.g., etched, deposited, etc.) through the housing and conductive materials applied to the walls thereof to create the electrically conductive microchannels. Also, the electrical connections with the electrically conductive microchannels need not be metal wires. Electrically conductive material may be strategically integrated/printed in portions of the housing, etc. Moreover, the electrically conductive microchannels can have different number, orientation, shape, placement, etc. as particular designs permit.

Figure 4:
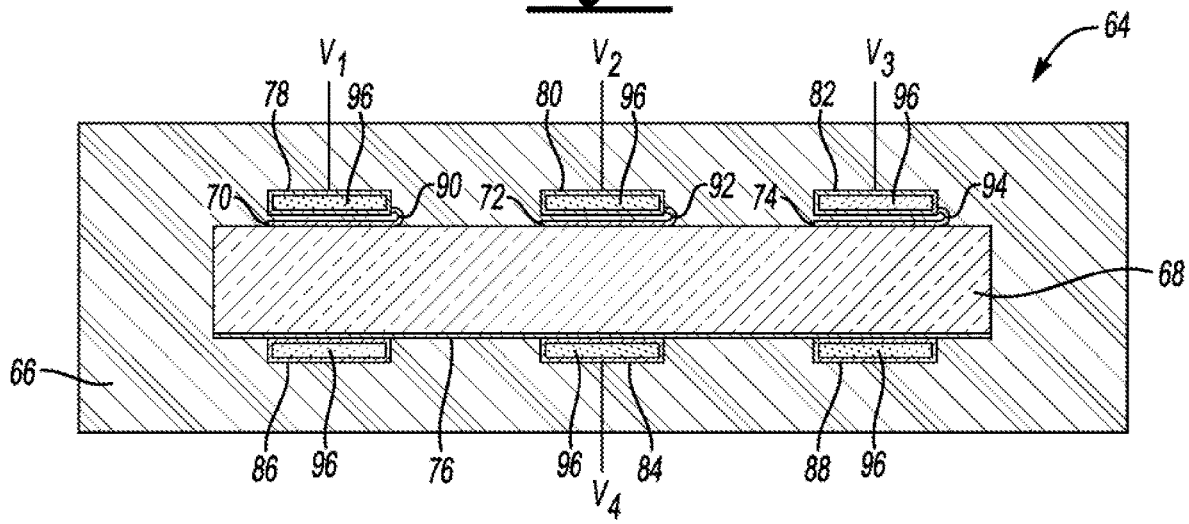
FIG. 4 is a side view, in cross-section, of another semiconductor device with integrated electrically conductive cooling channels.

With reference to FIG. 4, another example semiconductor switch 64 (e.g., MOSFET, insulated gate bipolar transistor, etc.) includes a housing 66, and various semiconductor componentry 68 and metal layers 70, 72, 74, 76 contained within the housing 66. The semiconductor switch 64 also includes electrically conductive microchannels 78, 80, 82, 84 and non-electrically conductive microchannels 86, 88. Each of the electrically conductive microchannels 78, 80, 82 is electrically connected with a respective one of the metal layers 70, 72, 74 via electrically conductive leads 90, 92, 94. The electrically conductive microchannel 84 and each of the non-electrically conductive microchannels 86, 88 are in direct contact with the metal layer 76: No electrically conductive leads are necessary.

As with those described above, the electrically conductive microchannels 78, 80, 82, 84 and non-electrically conductive microchannels 86, 88 may be used in concert with a heat transfer system to facilitate the removal of heat from the semiconductor switch 64 by directing coolant 96 through the housing 66 in proximity to the semiconductor componentry 68 and metal layers 70, 72, 74, 76. Similarly, the electrically conductive microchannels 78, 80, 82, 84 may be used in concert with a power system such that the electrically conductive microchannels 78, 80, 82, 84 serve as terminals for the semiconductor switch 64.

Because the cooling channels described herein serve dual purpose (directing coolant and being electrically conductive), space efficient designs can be produced. Separate terminal configurations associated with certain semiconductor devices can be eliminated increasing package flexibility.

The processes, methods, or algorithms contemplated herein with respect to control of cooling fluids through the channels, control of voltage or current applied to semiconductor devices via the channels, etc. can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (RUM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

The words used in the specification are words of description rather than limitation, and it is understood that various changes may be made without departing from the spirit and scope of the disclosure and claims. Certain examples above are described within the context of certain MOSFET technology. The electrically conductive integrated cooling channel technology contemplated herein, however, may be applied within the context of any appropriate semiconductor technology (e.g., BIT technology, IGBT technology, integrated circuit packages thereof, etc.)

In an alternative arrangement for example, a power system may electrically communicate with a semiconductor device via electrically conductive fluid in the channels. In such an arrangement, each cooling channel may be electrically and fluidly isolated from others individual pumps or the like may be necessary. Charge/potential can then be applied to the fluid in each channel as appropriate and thus passed to a corresponding terminal of the semiconductor device in question. Other arrangements are also contemplated.

As previously described, the features of various embodiments may be combined to form further embodiments that may not be explicitly described or illustrated. While various embodiments may have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A semiconductor assembly:
   a power semiconductor;
   a housing containing the power semiconductor; and
   electrically conductive channels, (i) configured to carry coolant through the housing to absorb heat generated by the power semiconductor and (ii) electrically connected with the power semiconductor to form terminals for the power semiconductor.

2. The semiconductor assembly of claim 1 further comprising a heat transfer system configured to move the coolant through the electrically conductive channels, and a power system electrically connected with the electrically conductive channels to provide current or voltage to the power semiconductor.

3. The semiconductor assembly of claim 1, wherein the power semiconductor includes metal layers and wherein each of the electrically conductive channels is electrically connected to one of the metal layers.

4. The semiconductor assembly of claim 3, wherein the electrically conductive channels are in direct contact with the metal layers.

5. The semiconductor assembly of claim 3, wherein the electrically conductive channels are electrically connected to the metal layers via metal wires or metal traces.

6. The semiconductor assembly of claim 1, wherein the power semiconductor is an insulated-gate bipolar transistor, a diode, a metal-oxide-semiconductor field-effect transistor, or a thyristor.

7. The semiconductor assembly of claim 1 further comprising electrically conductive fluid in the electrically conductive channels.

8. The semiconductor assembly of claim 1, wherein the housing is electrically insulative.

9. A semiconductor device comprising:
   a semiconductor substrate and metal layers arranged to form a semiconductor switch;
   a housing containing the semiconductor switch;
   electrically conductive channels (i) configured to carry fluid through the housing to cool the semiconductor switch and housing and (ii) electrically connected with the metal layers; and
   a power system configured to provide current or voltage to the electrically conductive channels.

10. The semiconductor device of claim 9, wherein each of the electrically conductive channels is electrically connected to one of the metal layers.

11. The semiconductor device of claim 10, wherein the electrically conductive channels are in direct contact with the metal layers.

12. The semiconductor device of claim 10, wherein the electrically conductive channels are electrically connected to the metal layers via metal wires or metal traces.

13. The semiconductor device of claim 9, further comprising a heat transfer system configured to move the fluid through the electrically conductive channels.

14. The semiconductor device of claim 9, wherein the semiconductor switch is an insulated-gate bipolar transistor or a metal-oxide-semiconductor field-effect transistor.

15. The semiconductor device of claim 9, wherein the housing is insulative.

16. A power apparatus comprising:
   a semiconductor assembly including a semiconductor switch, a housing containing the semiconductor switch, and electrically conductive conduits electrically connected with the semiconductor switch and configured to carry coolant therein and through the housing to absorb heat generated by the semiconductor switch;
   a heat transfer system configured to move the coolant through the electrically conductive conduits; and
   a power system configured to provide current or voltage to the electrically conductive conduits.

17. The power apparatus of claim 16, wherein the electrically conductive conduits are electrically connected with the semiconductor switch via metal wires or metal traces.

18. The power apparatus of claim 16, wherein the electrically conductive conduits are in direct contact with the semiconductor switch.

19. The semiconductor assembly of claim 16, wherein the semiconductor switch is an insulated-gate bipolar transistor or a metal-oxide-semiconductor field-effect transistor.

20. The semiconductor assembly of claim 16, wherein the housing is electrically insulative.

* * * * *